(12) United States Patent
Furukawa et al.

(10) Patent No.: US 7,149,233 B2
(45) Date of Patent: Dec. 12, 2006

(54) SEMICONDUCTOR LASER DEVICE AND ITS MANUFACTURING METHOD

(75) Inventors: Yoshihiko Furukawa, Anan (JP); Makoto Shimada, Anan (JP); Akiyoshi Kinouchi, Anan (JP); Masanao Ochiai, Anan (JP); Masayuki Senoh, Anan (JP)

(73) Assignee: Nichia Corporation, Tokushima (JP)

( * ) Notice: Subject to any disclaimer, the term of this patent is extended or adjusted under 35 U.S.C. 154(b) by 219 days.

(21) Appl. No.: 10/480,825

(22) PCT Filed: Jun. 12, 2002

(86) PCT No.: PCT/JP02/05846

§ 371 (c)(1),
(2), (4) Date: May 7, 2004

(87) PCT Pub. No.: WO02/103865

PCT Pub. Date: Dec. 27, 2002

(65) Prior Publication Data

US 2004/0233950 A1    Nov. 25, 2004

(30) Foreign Application Priority Data

Jun. 15, 2001 (WO) .................. PCT/JP01/05158

(51) Int. Cl.
*H01S 5/00* (2006.01)
(52) U.S. Cl. .................................. 372/49.01
(58) Field of Classification Search .............. 372/49.01
See application file for complete search history.

(56) References Cited

U.S. PATENT DOCUMENTS 4,951,291 A * 8/1990 Miyauchi et al. ........ 372/49.01

FOREIGN PATENT DOCUMENTS

| JP | 61-272987 | 12/1986 |
|---|---|---|
| JP | 04-255285 | 9/1992 |
| JP | 08-191171 | 7/1996 |
| JP | H08-191171 | 7/1996 |
| JP | 09-223844 | 8/1997 |
| JP | H09-223844 | 8/1997 |
| JP | 09-260777 | 10/1997 |
| JP | 11-074615 | 3/1999 |
| JP | 11-74615 A * | 3/1999 |
| JP | H11-74615 | 3/1999 |
| JP | 11-354891 | 12/1999 |
| JP | H11-354891 | 12/1999 |
| JP | 2000-031601 | 1/2000 |

* cited by examiner

Primary Examiner—Armando Rodriguez
Assistant Examiner—Rory Finneren
(74) Attorney, Agent, or Firm—Nixon & Vanderhye P.C.

(57) ABSTRACT

A semiconductor laser device have, on a substrate, a semiconductor layer including an active layer sandwiched between an n-type layer and a p-type layer, the semiconductor layer having a sonator face formed by etching and a projection projecting out in an emission direction relatively to the resonator face, wherein a protective film is formed to extend from the resonator face to an end face of the projection, and, an emission critical angle, which is the largest angle at which light emitted from the resonator face can be radiated without being blocked by the projection and the protective film formed on the projection, is larger than an emission half-angle of an emission distribution in a vertical direction of a laser beam emitted from the resonator face.

17 Claims, 5 Drawing Sheets

SEMICONDUCTOR LASER DEVICE AND ITS MANUFACTURING METHOD

This application is the US national phase of international application PCT/JP02/05846, filed on 12 Jun. 2002, which designated the US. PCT/JP02/05846claims priority to PCT/JP01/05158 filed 15 Jun. 2001. The entire contents of these applications are incorporated herein by reference.

TECHNICAL FIELD

The present invention relates to a semiconductor laser device having a resonator face formed by etching, particularly to a semiconductor laser device using a group III-V nitride semiconductor such as GaN, AlN, InN or mixed crystal thereof ($In_bAl_dGa_{1-b-d}N$, $0 \leq b$, $0 \leq d$, $b+d<1$) and its manufacturing method.

TECHNICAL BACKGROUND

Today, there is an increasing demand for the use of semiconductor laser devices using nitride semiconductors for large-capacity high-density optical disk systems which are capable of recording and reproducing a large volume of data such as DVDs. For this reason, enthusiastic study is being done on semiconductor laser devices using nitride semiconductors. The semiconductor laser devices using nitride semiconductors are considered to be capable of oscillating and emitting a wide range from the ultraviolet region to visible wavelengths including the red region and they are expected to have a wide range of applications including not only light sources for the above-mentioned optical disk systems but also light sources for laser printers, optical networks and the like.

Semiconductor laser devices require resonator faces for producing resonance of light from an active layer within a semiconductor layer and defining a waveguide region as an essential constituent for emitting a laser beam. The resonator faces can be formed by means of cleavage, etching, polishing and the like, which are selected as appropriate according to material. For example, in case of semiconductor laser devices using GaAlAs, GaAlAsP, GaAlInP and the like grown on GaAs substrates, which are capable of emitting light at long wavelengths such as infrared, red and the like, the resonator faces are often formed by cleavage, taking advantage of cleavability of the GaAs substrates.

On the other hand, nitride compound semiconductors are often grown on hetero substrates such as sapphire ($Al_2O_3$) that do not have cleavability. In the case of such substrates, it is difficult to form the resonator faces by cleaving the semiconductor layer with the help of the cleavability of the substrates, and therefore, the resonator faces are often formed by etching. For obtaining chips thereafter, the substrates are split by applying physical force through a means of scribing and the like because it is difficult to etch sapphire substrates.

The resonator faces are provided with reflective films for is improving light-reflectivity. In the case where division into devices is made through cleavage, it is easy to form uniform reflective films on entire end faces because the end faces of the devices including the resonator faces have a single plane. However, where the resonator faces are formed by etching, there is a problem in that satisfactory reflective films are often not formed because the end faces are uneven. For this reason, there is a problem in that, even if the resonator faces of the semiconductor layer have an excellent mirror surface, output can be poor according to the quality of reflective films formed on the resonator faces. There is also a problem in that a laser beam can be blocked because of the uneven end faces and the far field pattern (FFP) can be disturbed.

SUMMARY

The present invention is intended to provide a semiconductor laser device having improved characteristics by assisting a protective film formed on a semiconductor layer from impairing characteristics of the device and a method for manufacturing the device.

The semiconductor laser device of an exemplary embodiment of the present invention is characterized by having, on a substrate, a semiconductor layer including an active layer sandwiched between an n-type layer and a p-type layer, the semiconductor layer having a resonator face formed by etching and a projection projecting out in an emission direction relatively to the resonator face and characterized in that a protective film is formed to extend from the resonator face to an end face of the projection, and, an emission critical angle, which is the largest angle at which light emitted from the resonator face can be radiated without being blocked by the projection and the protective film formed on the projection, is larger than an emission half-angle of an emission distribution in a vertical direction of a laser beam emitted from the resonator face. With this construction, the laser beam is not blocked by the projection and the protective and therefore, a good FFP can be obtained.

The semiconductor laser device of an exemplary embodiment of the invention is also characterized by having, on a substrate, a semiconductor layer including an active layer sandwiched between an n-type layer and a p-type layer, the semiconductor layer having a resonator face formed by etching and a projection projecting out in an emission direction relatively to the resonator face and characterized in that a protective film is formed to extend from the resonator face to an end face of the projection, and, an angle β, which satisfies the relational expression: $\tan \beta = Y/X$ in which X is the distance from a surface of the protective film on the end face of the projection to the resonator face and Y is the distance from a topmost face of the protective film on an upper face of the projection to an emission portion of the resonator face, is larger than an emission half-angle of an emission distribution in a vertical direction of a laser beam emitted from the resonator face. With this construction, the protective film is so formed not to block the laser beam within the half-angle at half maximum of the emission distribution, and therefore, a good FFP can be obtained.

The projection of the semiconductor laser device of an exemplary embodiment of the invention may be such that the distance from a lower end of the active layer to an upper face of the projection is larger than the distance from the resonator face to the projection. With this construction, the emission critical angle can be increased, and therefore, a good FFP can be obtained more easily.

The projection of the semiconductor laser device of an exemplary embodiment of the invention may be such that the distance from a lower end of the active layer to an upper face of the projection is smaller than the distance from the resonator face to the projection. With this construction, part of the beam may interfere at the projection. However, for applications that do not use a foot portion of the spectrum of the laser beam, allowable margins in production process increase, and therefore, it is advantageous in yield.

The emission half-angle of the semiconductor laser device of an exemplary embodiment of the invention may be a half angle at half maximum of the emission distribution. This construction can avoid the blocking of light within the half angle at half maximum, which is the major light of the laser beam.

The protective film of the semiconductor laser device of an exemplary embodiment of the invention may be formed to extend continuously from the resonator face to the projection. The protective film can also serve as a dielectric mirror, and thereby, the protective film can prevent light leaking out of a waveguide region defined between resonator faces from being released out of the end face of the projection.

The protective film of the semiconductor laser device of an exemplary embodiment of the invention may be formed to reach a surface of the substrate. With this construction, the whole end face of the projection can be covered, and therefore, the light can be prevented from leaking from the end face of the projection.

The protective film of the semiconductor laser device of an exemplary embodiment of the invention is formed on a laser beam emission side. With this construction, the semiconductor laser device has a good FFP.

The protective film of the semiconductor laser device of an exemplary embodiment of the invention may have a curved surface at an edge defined between the upper face of the projection and the end face thereof. With this construction, the emission critical angle can be increased.

Preferably, the end face a projection on a monitor side of the semiconductor laser device of an exemplary embodiment of the invention has a lower reflectivity than the projection on the emission side. With this construction, the light leaking out of the waveguide region can be released from the projection on the monitor side.

In the semiconductor laser device of an exemplary embodiment of the invention, on the monitor side opposite to the resonator face on the emission side, the protective film may be formed on the resonator face but the semiconductor layer may be exposed at the end face of the projection. With this construction, an optional reflectivity difference can be set, and thereby, the leakage light can be released out efficiently.

The protective film of the semiconductor laser device of an exemplary embodiment of the invention may be a multilayer film. With this construction, the device can be protected and also the protective film can be a good reflective film.

The process of producing a semiconductor device of an exemplary embodiment of the invention is characterized by comprising the first end-face etch step of, after forming an n-type layer, an active layer and a p-type layer sequentially on a substrate to form a semiconductor layer, etching the semiconductor layer until the n-type layer is exposed, thereby forming a resonator face; the second end-face etch step of, after forming a mask from a surface of the p-type layer over the resonator face, further etching the n-type layer exposed by the first end-face etch step until a vicinity of the substrate is exposed, thereby forming a projection; the step of removing the mask to expose the resonator face; and the step of forming a protective film continuously from the exposed resonator face to an end face of the projection. Thereby, the resonator face and the projection are formed, and further the protective film continuous on the surface thereof can be formed efficiently.

Further the substrate may be exposed by the second etch step. Thereby, a dividing step can be carried out efficiently.

DETAILED DESCRIPTION OF EXEMPLARY EMBODIMENTS

A semiconductor laser device as embodiments of the present invention is hereafter described with reference to the drawings, but the semiconductor laser device of the present invention is not limited to the structures of the devices and electrodes described in the following embodiments.

Figure 1A:
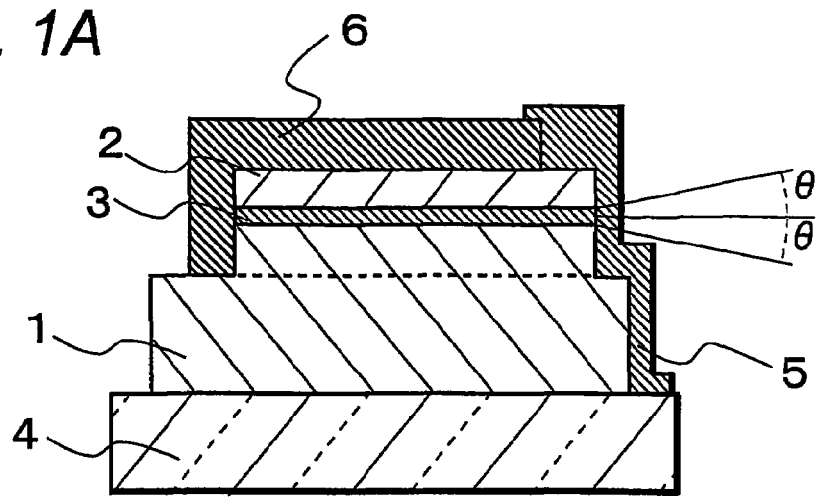
FIGS. 1A to 1C are schematic sectional views illustrating a semiconductor laser device in accordance with an exemplary embodiment of the present invention.

The semiconductor laser device as embodiment of the present invention, as shown in FIG. 1A, is a semiconductor laser device having a waveguide region formed in a stripe shape in a semiconductor layer including an n-type layer, an active layer and a p-type layer sequentially laminated on a substrate. A pair of resonator faces defining the waveguide region is formed by etching. The bottom of etching for forming the resonator faces forms the upper face of the projection projecting out respectively to the resonator face. The end face of the projection is formed by further etching up to the substrate. The substrate is divided at a position outside in relation to the end face of the projection to form a division plane.

Here the semiconductor laser device of the invention provides a good FFP since the laser beam (main beam) emitted from the resonator face is prevented from being disturbed in spite of the provision of the above-described projection.

Figure 1B:
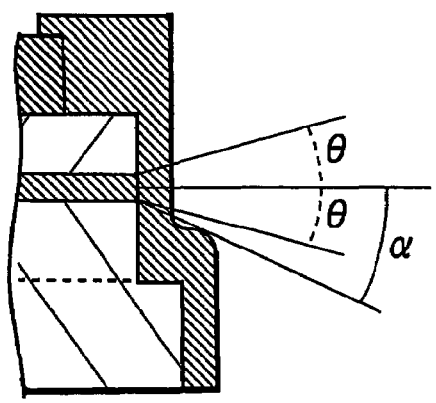

The semiconductor laser device of the invention as recited in claim 1 is provided with the protective film over the resonator face, the upper face of the projection and the end face of the projection. The device is particularly characterized in that the emission critical angle is larger than the emission half angle of the emission distribution of the laser beam in the vertical direction. The emission critical angle is the largest angel at which the light from the resonator face can radiate without being cut off by the projection and the protective film on the projection. In FIG. 1B, an angle α denotes the emission critical angle. FIG. 1B is a partially enlarged view of FIG. 1A for illustrating the emission portion. The angle α is an angle to a reference horizontal plane. As shown in FIG. 1B, in the case where the emission critical angle α is larger than the emission half angle θ of the emission distribution of the laser beam in the vertical direction, the main beam of the laser beam from the resonator face is not cut off by anything in the emission direction. Therefore, the FFP is not disturbed. Such specific relationship between the emission critical angle and the emission half angle of the emission distribution allows the emission of a laser beam with good FFP.

Figure 1C:
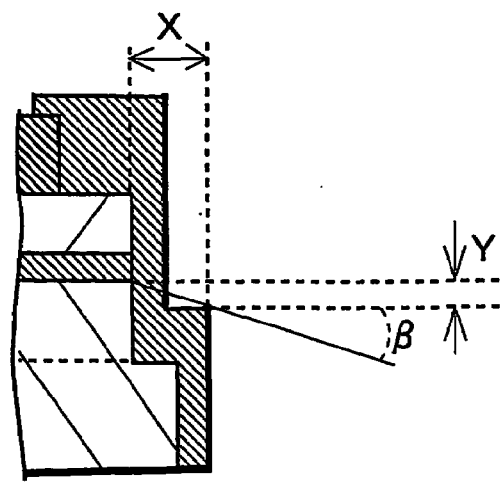

The semiconductor laser device of the invention as recited in claim 2 is provided with the protective film over the resonator face, the upper face of the projection and the end face of the projection. The device is particularly characterized in that an angle β, which satisfies the formula: tan β=Y/X wherein X is the distance from the resonator face to the surface of the protective film on the end face of the projection and Y is the distance from the emission portion of the resonator face to the uppermost face of the protective film on the upper face of the projection, is larger than the emission half angle of the emission distribution of the laser beam form the resonator face in the vertical direction. FIG. 1C, as FIG. 1B, is a partially enlarged view of FIG. 1A for illustrating the emission portion.

In the case where a protective film is formed on the resonator face and an projection is provided as in the invention, the protective film formed on the projection is the most likely to block the light emitted from the resonator face, and the protective film provided at the edge of the projection is particularly liable to cut the light off. The protective film located on the end face of the projection near the upper face of the projection is the farthest from the resonator face, and the distance from the surface of the protective film at this location to the resonator face is taken as X. If the protective film is formed to have a rounded shape at the edge of the projection, the distance to the surface of the protective film at the edge where the protective film is thickest can be defined as X. The distance X in this case is shorter than the distance X in the case where the protective film is formed to have an almost right angle at the edge as shown in FIG. 1B. Consequently β becomes larger.

In the resonator face, a layer including the active layer and a light guide layer forms a waveguide layer, and, in a broad sense, the region sandwiched between upper and lower cladding layers is a light emitting portion. In the invention, Y is the distance from the bottom of the emitting portion to the protective film on the upper face of the projection. The protective film on the upper face of the projection means the upper face of a part of the protective film which part projects out relatively to the emission portion of the resonator face and is formed on a plane parallel to the substrate. If the protective film is not on a plane parallel to the substrate, Y is defined as the distance to the highest part of the protective film on the upper face of the projection.

The specific relationship between X and Y as defined above and the emission half angle of the emission distribution allows a good FFP to be obtained.

The emission angle 2θ of the emission distribution in the vertical direction of the laser beam emitted from the resonator face is determined depending upon the structure of the waveguide and the resonator face. However, since the emission angle is preferably about 25 to 30 degrees, it is possible to avoid the disturbance of the FFP by setting a larger angle β which is defined by the emission critical angle α, X and Y than about 25 to 30 degrees.

(Projection)

The semiconductor laser device of the invention has the projection projecting out relatively to the resonator face formed by etching. The projection has, as its upper face, the bottom of etching at etching for forming the resonator face. Such a projection is hard to form if the resonator face is formed by cleavage. There are some cases where projections are not formed even if resonator faces are formed by etching. However, according to the invention, the projection formed by etching is provided for ensuring the uniformity of the resonator face, for preventing the breakage of the device at dividing (at chip formation) and further for preventing mixing the main beam with light (stray light) leaking from the waveguide region, in the semiconductor laser device having the resonator face formed by etching. Furthermore, the laser beam from the resonator face is not blocked by the projection.

The distance between the end face of the projection and the resonator face affects the blocking of the laser beam, and the shorter the distance is, the more preferable. The shortening (decrease) of the distance enables the end face of the semiconductor layer to have a smaller step and to have an almost single plane as a cleavage plane. Thus, light is not liable to be cut off, and the semiconductor laser device can be used whatever application may be. However, if the distance is too small, severe conditions on alignment accuracy and the like need to be satisfied at photolithography. Also it is difficult to form the protective film and the like, and the resonator face is liable to be roughened at etching. As a result, mass-productivity is not high.

Here, the distance from the resonator face to the end face of the projection can be increased to some degree by adjusting the distance between the upper face of the resonator face and the bottom of the active layer. In other words, if the projection is projected from a position at a distance sufficiently far from the active layer, the above problem becomes insignificant. However, since the distance from the bottom of the active layer to the upper face of the projection depends upon an etch depth at the formation of the resonator face, it is preferable that the distance is a little larger than the above-mentioned distance to the end face of the projection for preventing the resonator face from being roughened by etching.

As discussed above, a preferable range for the shape of the projection can vary depending upon its positional relationship with the active layer and its distance therefrom. Desired characteristics of the semiconductor laser device can vary depending upon its application and the like. Therefore, the shape of the projection may be selected suitably for each application. Among selectable shapes thereof, the projection can be formed so as not to block the laser beam by forming the projection such that the distance from the bottom of the active layer to the upper face of the projection is larger than that from the resonator face to the end face of the projection. Thus, the light from the resonator face becomes unliable to be cut off.

Figure 6:
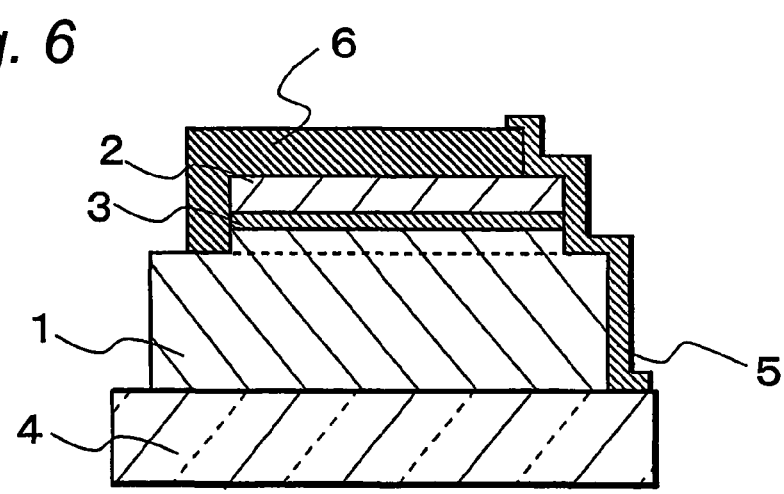
FIG. 6 is a schematic sectional view of a semiconductor laser device in accordance with an exemplary embodiment of the present invention.

Contrarily, as shown in FIG. 6, it is possible to make the distance from the bottom of the active layer to the upper face of the projection shorter than that from the resonator face to the end face of the projection. This construction facilitates the formation of a mirror on the resonator face, and also in a manufacturing process, desirable resonator faces can be obtained with good yield.

Figure 2:
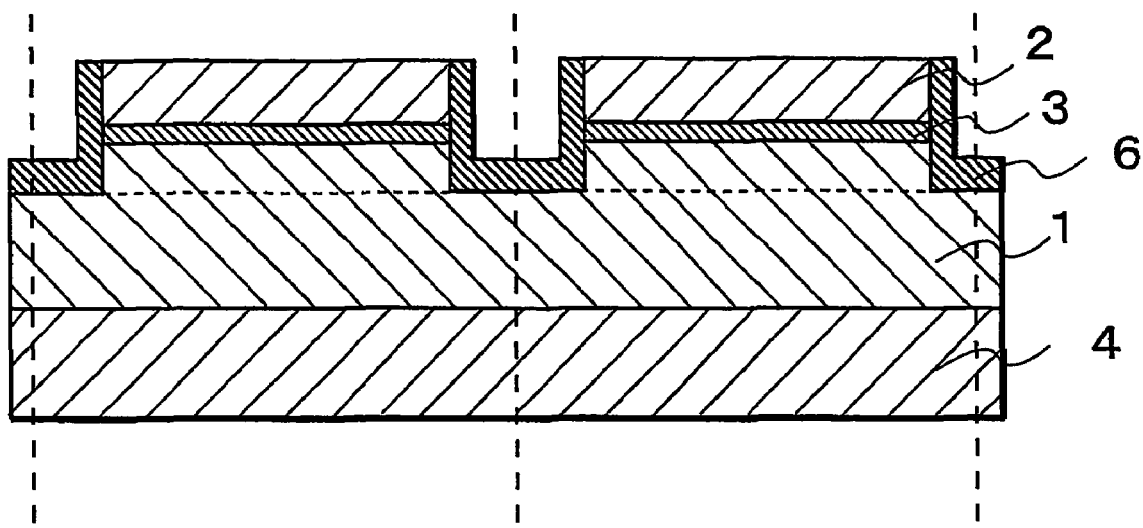
FIG. 2 is a schematic sectional view of a semiconductor laser device for comparison with the present invention.

For controlling the above-mentioned distance relationship, it is preferable to form the end face of the projection by etching. For, if the end face of the projection is formed by cleavage as shown in FIG. 2, a cleavage plane needs to be set apart from the resonator face for avoiding the occurrence of cracks by cleavage and consequently the laser beam is liable to be blocked. Particularly, it is difficult to divide a gallium nitride semiconductor layer that is grown on a hetero substrate and is difficult to cleave, at a targeted position, and it is difficult to control the distance from the resonator face to the end face of the projection. In contrast, the formation of the end face of the projection by etching as in the invention is free of such problems.

(Emission Distribution)

In the invention, the emission distribution of the laser beam in the vertical direction is determined by the constitution of the waveguide and the condition of the resonator face. As constitutional factors of the waveguide, may be mentioned a difference between the refractive index of the light-emitting layer including the active layer and the light guide layer and the refractive index of the cladding layers for confining light in the light-emitting layer, the thickness and the composition of these layers and the like. As for the condition of the resonator face, may be mentioned the case where the resonator face has a uniform single plane close to a mirror surface and the case where the resonator face has a somewhat rough face though the resonator face functions as a resonator face. The condition of the resonator face depends upon how the resonator face is formed.

According to the invention, the projection and the protective film can be defined so that the laser beam within the emission half angle, particularly, half angle at half maximum of the emission distribution in the vertical direction is not blocked. At application of the laser beam, it is possible to use laser beam only within the half angle at half maximum of the emission distribution. In such cases, there is no particular harm even if light emitted at angles larger than the half angle at half maximum is blocked by the protective film and the like. If the projection is to be formed closely to the resonator face, the formation thereof needs to be done accurately, costs increase correspondingly and the yield worsens. However, if allowable limits are broadened according to the application, production with a good yield is possible.

(Protective Film)

The protective film can be formed on at least one of the pair of resonator faces which is on the light emission side, i.e., in a direction of emitting the laser beam, and thereby a good FFP can be obtained. Referring to FIG. 1A, the resonator face on the left is one on the light reflection side (i.e., the monitor side on which a mirror with a higher reflectivity than that on the emission side is formed). Less light is emitted from the resonator face and more or less blocking of emitted light does not cause particular problems. Therefore, it is sufficient that the relationship between the emission critical angle and the emission distribution as well as the angle β defined by X and Y is satisfied at the resonator face on the emission side where the protective film is formed.

In the case where protective films are formed on both the resonator faces, i.e., the resonator face on the emission side and that on the reflection side (the monitor side), two reflective films are set to have different reflectivities. The resonator face provided with the reflective film of lower reflectivity serves as the resonator face on the emission side, and the resonator face provided with the reflective film of higher reflectivity serves as the resonator face on the reflection side, for emitting the laser beam. The higher output the semiconductor laser device produces, the higher reflectivity the reflective film (the protective film) is required to have, and a multilayer film may be used as a protective film having excellent reflection property.

The thickness of the protective film is desirably $\lambda/4n$ providing the oscillation wavelength is $\lambda$ and the refractive index of the protective film is n. The adjustment of the thickness in this way facilitates the control of reflection of light.

For the protective film provided at the resonator face particularly on the emission side, its material and thickness can be selected optimally according to the application and purpose of the device. For example, by forming the protective film which has a lower refractive index than the refractive index on the monitor side, the laser beam can be effectively emitted. By forming the protective film as a light-transmissive film instead of a reflective film, slope efficiency can be raised and the semiconductor laser device can be rendered suitable particularly for applications requiring high power. The protective film can also be formed as a simple protective film that does not function as a reflective film having a lower reflectivity or as a light-transmissive film. The formation of the reflective film or the light-transmissive film allows the control of resonance of light in the waveguide. However, a film that does not have these functions, for example, a film using a material having a refractive index approximate to that of nitride semiconductors such as $Nb_2O_3$ functions as a non-existing (absent) film and can suppress deterioration of the end face to a minimum. Thereby relatively high power laser beam can be output. In the case of the light-transmissive film, the semiconductor laser device exhibits excellent characteristics for high-power application. However, if return light exists, the transmissive film can transmit the return light. In such a case, it is preferable to provide a non-existing film.

(Protective Film Continuous from the Resonator Face to the Projection)

Preferably the protective film is provided continuously from the resonator face to the end face of the projection. A protective film 5 provided on the right in FIG. 1A, that is, on the emission side, and protective films in FIGS. 1B and 1C are formed continuously from the resonator face to the projection. This continuous formation renders the protective film uniform in quality. In this case, it is important that the protective film is optically continuous. Where the protective film is not continuous, light potentially reflected inside may be emitted therefrom, which adversely affect the FFP. Particularly, as shown in FIG. 3, where a protective film 6 has an end face oriented in the same direction as the emission face, light leaks therefrom, which disturbs the FFP.

In the case where the resonator face is formed by cleavage, a plane including the resonator face is an end face of the device and is a single plane. Therefore the protective film can be formed under good control and with high quality. In contrast, in the case where the resonator face is formed by etching, the reflective film (protective film) 6 can be embedded from above a laminate structure still in a wafer state, and therefore, the reflective film can be formed efficiently by fewer production steps.

Figure 3:
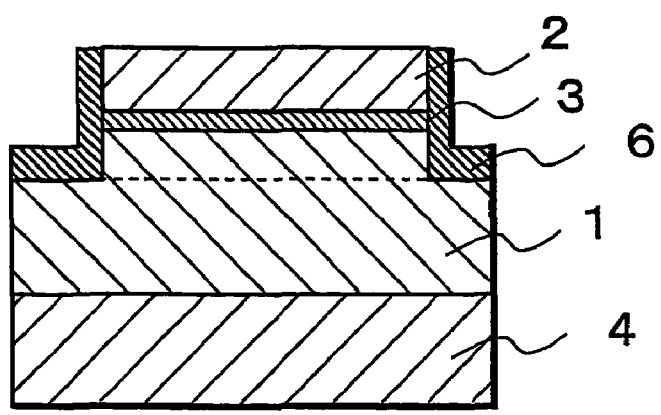
FIG. 3 is a schematic sectional view of a semiconductor laser device for comparison with the present invention.
Figure 7:
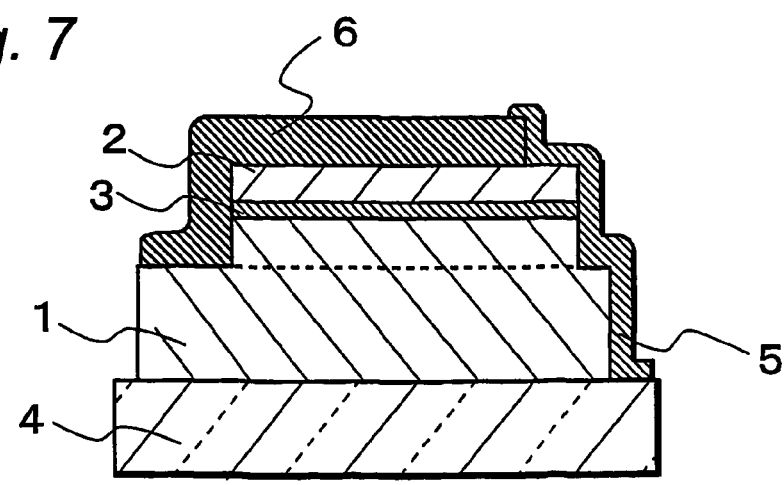
FIG. 7 is a schematic sectional view of a semiconductor laser device in accordance with an exemplary embodiment of the present invention.

However, as shown in FIG. 3, the thus formed reflective film (protective film) 6 is not formed on the end face of the projection below the upper face of the projection, and the end face of the semiconductor layer and that of the substrate are exposed there. For this reason, light (stray light) leaked out of the waveguide region may be released from the end face of the projection. Also light reflected inside the device is released from other parts than the emission portion of the resonator face. These lights, if mixed with the laser beam, disturb the FFP. In the invention, the reflective film (protective film) formed on the resonator face formed by etching also covers the end face of the projection of the semiconductor projecting out relatively to the resonator face, and thereby, the stray light as mentioned above can be prevented from being released out. As for the protective film on the monitor side, the upper face of the projection may be exposed as shown in FIG. 1A, or the protective film may be formed to cover almost all the upper face of the projection as shown in FIG. 7.

Further, in the case where the protective film is formed on the end face of the projection, it is preferable that the film is formed to reach the surface of the substrate as shown in FIG. 1A. In the semiconductor laser device formed as shown in FIG. 3, the end face of the protective film is formed on the same plane as the end face of the projection. In other words, the end face of the protective film is formed on a plane facing the laser beam emission direction. Therefore, light propagating through the inside of the protective film is released in the same direction as the laser beam and is mixed with the laser beam, which deteriorates the FFP. In the invention, however, because the protective film is formed continuously to the end face of the projection, the light propagating through the inside of the protective film propagates through the protective film on the upper face of the projection and the protective film on the end face of the projection and is released from a position apart from the laser beam emitting position in a different direction from that of the laser beam. Therefore, the FFP is hardly affected.

Also, since the protective film is also formed on the end face of the projection, a portion including the semiconductor and the protective film projects out relatively to the resonator face. Therefore, by setting the distance therebetween before hand, it is possible to prevent the laser beam from being cut off. Here, in the invention, the FFP is prevented from deteriorating by setting the relationship between the projection, the protective film formed on the projection and the laser beam as follows.

In the case where the protective film is formed continuously from the resonator face to the end face of the projection, the protective film is preferably formed to have a curved face at the edge defined between the upper and end faces of the projection. In FIG. 1A, the protective film at the edge of the projection is formed to have a curved face. Referring to FIG. 1C which illustrates a modified example of FIG. 1B, it is needless to say that the angles α and β may be used for either shape. It is not easy to form the protective film having only flat faces as shown in FIG. 1C, but actually it is easy to form curved faces particularly at corners (edges) as shown in FIG. 7 and FIG. 1B. Other schematic figures with flat faces should also be construed as including curved faces. In other figures, even if they are drawn to have only flat faces, the emission critical angle α and the angle β defined by X and Y in FIG. 1C can be increased by changing the flat faces into curved faces.

(Protective Film on Projection)

The protective film on the resonator face on the emission side is preferably formed continuously to the end face of the projection as described above. However, on the monitor side, the protective film may not be formed on the end face of the projection. As shown in FIG. 1A, the protective film with a lower reflectivity is formed on the resonator face on the emission side and the protective film with a higher reflectivity is formed on the resonator face on the monitor side, while, regarding the projection, the protective film on the emission side is continuous from the resonator face to the projection and the protective film on the reflection side may not be formed on the projection. With this construction, a refractive index relationship between the projections is reverse to that between the resonator faces. More specifically, since the end face of the projection is exposed on the monitor side, the end face of the projection on the emission side has a higher reflectivity than the end face of the projection on the monitor side. In FIG. 1A, on the end face of the projection on the monitor side, the protective film is not formed and the semiconductor layer is exposed. On the projection on the emission side, the protective film is formed continuously from the resonator face situated above. Thus, when the light leaked out of the waveguide region propagates through the inside of the device and reaches the n-type layer including the projection, the light is prevented from resonating on the end face of the projection and is released outside from the end face of the projection on the monitor side.

For setting such a difference between the reflectivity on the monitor side and the reflectivity on the emission side, the semiconductor layer may be exposed on the end face of the monitor side as shown in FIG. 1A, or the protective film with a lower reflectively than the protective film on the emission side may be provided on the monitor side.

As discussed above, for outputting high power, the light-transmissive film is preferably provided on the resonator face. By providing such a light-transmissive film also on the end face of the projection, it is possible to prevent the leakage light from being amplified by the projection. Where the protective film is not formed, light is reflected and amplified owing to a refractive index difference between the semiconductor layer, if exposed, and the external air. If such light is mixed with the main beam, the FFP worsens. Although the light amplified by the exposed end face of the projection of the semiconductor layer is weak, it will be obtrusive when it is mixed with weak light at the foot of the spectrum of the main beam. However, the light-transmissive film formed on the end face of the projection will suppress the reflection on the end face of the semiconductor layer, light is released outside before being reflected and amplified. Such weak light does not cause problems if it is mixed with the main beam, and therefore, it hardly affects the characteristics.

The relationship between the reflectivities on the end faces of the waveguide region is thus set inverse to that between the reflectivities on the end faces of the projection. In other words, the protective film is formed on the projection on the emission side and is not formed on the end face of the projection on the monitor side. Thereby the light leaked out of the waveguide region is reflected by the protective film formed on the end face of the projection and released from the monitor side.

Or, the end face of the projection is provided with a protective film having the reflectivity that provides the same relationship in the same direction as the relationship between the reflectivities on the end face of the waveguide region. More specifically, the light-transmissive film is formed on the end face of the projection on the emission side and no film is formed on the monitor side, so that the projection has a higher reflectivity. Thereby the leakage light cannot be amplified and can be released from the emission side as weak light. Thus, even if the relationship between the reflectivities on the emission side and on the monitor side is the same on the resonator faces and on the projections, good beam characteristics can be obtained by setting not absolutely the same relationship but relatively the same relationship in the same direction and providing the light-transmissive film on the end face of the projection on the emission side.

Further, as described above, the light-transmissive film may preferably be formed as the protective film on the resonator face for outputting high power. However, if the return light exists, a non-existing film is preferably formed as the protective film on the resonator face. The formation of such a non-existing film does not change the effect of the leakage light on the main beam but can suppress deterioration due to exposure. Particularly, where the projection on the emission side is exposed, impurities in the air (for example, carbon, etc.) may adhere to the end face of the projection, deteriorate the end face and adversely affect the semiconductor layer. In some cases, the impurities cause heat, which propagates to the resonator face and raises the temperature of the resonator face. That can be a cause of deterioration. For this reason, the protective film is preferably formed on the end face of the projection on the emission side for protection against external influence even if the protective film itself does not have the function of suppressing the release of the leakage light to the outside or reducing the amplification thereof. Furthermore, because the continuous formation of the protective film from the resonator face prevents the end face of the protective film from facing the emission direction, the non-existing film, if required as the protective film on the resonator face, is preferably continuous to the end face of the projection.

The protective film on the emission side preferably overlaps the protective film on the monitor side. Referring to FIG. 1A; the protective film on the monitor side is formed in such a size as covers more than half the upper face of the semiconductor layer and the protective film on the emission side is formed to overlap part of the protective film on the monitor side. This overlapping of the two protective films prevents impairment of insulating property. Particularly, in the case where the device is used facedown, interstices easily cause short-circuit, and it is preferable that the protective films are formed without interstices.

Also, since the overlap formation suppresses the exposure of the semiconductor layer, it suppresses deterioration and mixture of impurities. The size of an overlapping portion is not particularly important. It is preferable that the overlapping portion is formed in a size such that it does not extend to the resonator face on the opposite side and change the reflectivity thereof. The overlapping portion is preferably situated not right above the resonator face but in a position more or less shifted therefrom as shown in FIG. 1A. If the protective film on the monitor side extends to right above the resonator face on the emission side, the protective film will be formed further on it and will peel off readily. If the protective film extends from the monitor side to a position a little away from the resonator face on the emission side, as shown in FIG. 1A, the protective film on the emission side can be formed to contact the semiconductor layer right above the resonator face, so that the protective film on the emission side has good adhesion and can hardly peel off.

Figure 5:
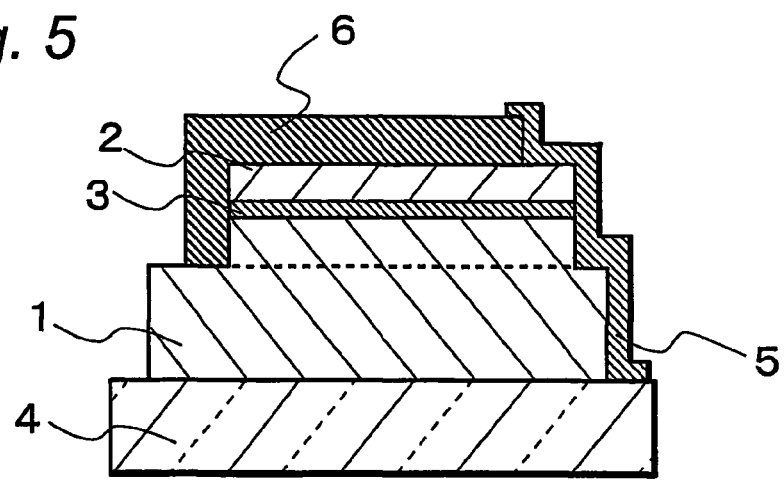
FIG. 5 is a schematic sectional view of a semiconductor laser device in accordance with an exemplary embodiment of the present invention.

On both the emission side and the monitor side, the protective films are preferably formed on the end faces, for example, by deposition in a direction perpendicular to the laminating plane of the semiconductor layer. In such formation, since the protective films can be formed to have intended thickness, the protective films on the upper faces of the projection and the semiconductor layer are often formed as thick as or thicker than those on the end faces, as shown in FIG. 5 and FIG. 1A, respectively. Since the electrode is formed not on the end face but on the upper face, the formation of the thicker protective film on the upper face than on that the end faces provides good insulating property. If the overlapping portion of the protective films extending from the emission side and the monitor side is situated at a position a little away from the end face on the emission side as discussed above, the protective films can hardly peel off even if it is thick to some extent.

As for end faces of the substrate, the protective film may not be provided in either of the end faces in a light resonance direction (waveguide direction). In FIG. 1A, the protective film is not formed on either end face. Because the substrate is at a large distance from the waveguide region, the leakage light hardly reaches the substrate, and therefore, the beam characteristics are not affected significantly whether or not the protective film is provided.

As materials for the protective film, $ZrO_2$, MgO, $Al_2O_3$, $TiO_2$, $Si_3N_4$, $SiO_2$, AlN, $MgF_2$ and the like may be suitably used, and especially $ZrO_2$, $SiO_2$ and $TiO_2$ are suitably used. These materials can be formed into a multilayer film, which makes an excellent protective film and dielectric reflective film by taking into consideration the refraction indices thereof and controlling the thickness thereof. In the case where the multilayer film is formed, it is necessary to form the film that does not block the laser beam by controlling the thickness as defined above because the multilayer protective film tends to be thick on the upper face of the projection. Further, for providing a difference in the refractive index, different materials may be used on the reflection side and on the emission side or the same material may be formed to have different thicknesses.

(Manufacture Method)

In the semiconductor laser device of the invention, the resonator face and the end face of the projection are both formed by etching, and at least two end-face etch steps are carried out according to the invention. That is, the invention has a first end-face etch step for forming the resonator face and a second end-face etch step for forming the end face of the projection. In the production process, since etch steps are carried out for forming a ridge and the like other than the end faces, these etch steps are distinguished from the end-face etch steps.

In the first end-face etch step, if etch depth is large, the resonator face previously formed are roughened and a mirror face is hard to obtain. Therefore, the etch depth is preferably not large. Preferably the end face of the projection is also formed by etching like the resonator face. In this step, it is preferable that the upper face of the projection is formed closely to the emission portion of the resonator face and the end face of the projection is formed closely to the resonator face within such an extent that the laser beam is not blocked. By these separate etch steps, it is possible to form a good resonator face and a small projection that does not block the laser beam emitted from the resonator face. Further, by carrying out etching at the formation of the end face of the projection until the substrate is exposed, it is possible to avoid occurrence of cracks in the semiconductor in a later step of chip formation (dividing). Since the end face of the projection is not required to have a mirror surface, it does not cause any problems if deep etching is carried out to expose the substrate.

The two end-face etch steps are performed as described above. The invention includes the step of forming a protective film between the two etch steps. The resonator face formed by the first end-face etch step is covered and protected with a mask before the second end-face etch step. If the protective film is formed before coverage with the mask, that causes the problem that the protective film is not formed on the end face of the projection. Also there is a problem in that the material of the mask is roughened by the second end-face etch step and even the protective film is roughened. It has been considered that the end face of the protective film is particularly liable to be roughened but that the resonator face is not immediately affected, and therefore, the protective film has been formed before the second end-face etch step by placing prime importance on mass-productivity. According to the invention, these problems are solved by forming the continuous protective film after the second end-face etching. Moreover, because the continuous protective film is formed before the substrate is divided, an excellent protective film can be formed without impairing the mass-productivity.

Also, as discussed above, the reflection side requires the protective film to have a higher reflectivity than the protective film on the emission side. Therefore, the protective film on the reflection side is required to have a larger thickness and is preferably formed by a separate production step from the protective film on the emission side. As shown in FIG. 1A, it is possible to form the protective film without particularly increasing the number of production steps, by providing the protective film also with an insulating film function of protecting the upper face of the device and the like.

(Etching Means)

In the manufacture method of the invention, if dry etching such as RIE (reactive ion etching) is used as means for etching a nitride semiconductor, it is preferable to use a fluorine compound gas such as $CF_4$ for etching a first protective film of silicon oxide which is often used in the first step. In the second step, for etching the nitride semiconductor, it is preferable to use chlorine gases such as $Cl_2$, $CCl_4$ and $SiCl_4$, which are often used for III-V group compound semiconductors because the chlorine gases provides a large selective etching ratio over silicon oxide.

(Chip Formation)

Since the resonator face formed by etching and the projection projecting out respective to the resonator face form end faces as they are, chip formation (division) is carried out with a plane positioned outside relatively to the projection as a division plane. As means for chip formation, scribing, dicing and the like may be used. In the case where division is performed by application of mechanical force, it is preferable that the division plane is only in the substrate, i.e., the substrate is exposed when the projection is formed, because that prevents cracks from occurring in the semiconductor layer.

EXAMPLES

Examples of the present invention are now described. The following examples are related to laser devices using nitride semiconductors. However, it is needless to say that the laser device of the invention is not limited thereto and can be carried out with use of various semiconductors within the technical idea of the invention.

Example 1

A laser device of a structure as shown in FIG. 1A using a nitride semiconductor is hereafter described. Example 1 uses a hetero substrate of a material different from the nitride semiconductor. The hetero substrate may be of a material different from the nitride semiconductor which material has been known to be able to grow the nitride semiconductor thereon, for example, an insulating substrate such as of sapphire with C plane, R plane or A plane as the principle plane and spinel ($MgAl_2O_4$), SiC (including 6H, 4H and 3C), ZnS, ZnO, GaAs, Si, an oxide substrate that lattice-matches with nitride semiconductors and the like. As preferable hetero substrates, may be mentioned sapphire and spinel. The hetero substrate may be off-angled, and in this case, a stepwise off-angled substrate is preferable because a base layer of gallium nitride can grow with good crystallinity. Further, in the case where the hetero substrate is used, after the nitride semiconductor is grown as the base layer on the hetero substrate prior to the formation of the device structure, the hetero substrate may be removed by a method such as polishing so that the device is constructed to have a single substrate of the nitride semiconductor. Or the hetero substrate may be removed after the device structure is formed. In the case where the hetero substrate is used, the nitride semiconductor grows well if the device structure is formed with intervention of a buffer layer and the base layer.

In the invention, the nitride semiconductor is grown by any method known to be capable of growing the nitride semiconductor such as MOVPE, MOCVD (metal organic chemical vapor deposition), HVPE (halide vapor phase epitaxy), MBE (molecular beam epitaxy) or the like.

(Buffer Layer)

A 2-inches φ hetero substrate 101 of sapphire with C plane as the principal plane is placed in a MOVPE reactor. The temperature is set to 500° C., and a buffer layer of GaN is grown to 200 Å thickness using trimethylgallium (TMG) and ammonia ($NH_3$).

(Base Layer)

After the buffer layer is grown, the temperature is raised to 1,050° C., and a nitride semiconductor layer of undoped GaN is grown to 4 µm thickness using TMG and ammonia. This layer acts as a base layer (growth substrate) for growing each layer constituting the device structure. Besides undoped GaN, if a nitride semiconductor grown by ELOG (epitaxially leterally overgrowth) is used as the base layer, a growth substrate providing good crystallinity can be obtained. Specific examples of ELOG-grown layers include a layer formed by growing a nitride semiconductor layer on a hetero substrate, providing on its surface a protective film on which the nitride semiconductor is hard to grow in order to form a striped mask region and a non-mask region on which the nitride semiconductor grows, and growing the nitride semiconductor from the non-mask region not only in a thickness direction but also in a lateral region, thereby growing the nitride semiconductor also in the mask region. Other example may be a layer formed by providing an opening in a nitride semiconductor layer grown on a hetero substrate and growing the nitride semiconductor in the lateral direction from the side of the opening.

Next, each layer forming the device structure is laminated on the base layer of the nitride semiconductor.

(n-Type Contact Layer)

An n-type contact layer of GaN doped with Si at $1\times10^{18}/cm^3$ is then formed to 4.5 µm thickness on the obtained nitride semiconductor layer (base layer) at 1050° C. using TMG, ammonia and silane gas as an impurity gas.

(Crack Inhibiting Layer)

Next, a crack inhibiting layer of $In_{0.06}Ga_{0.94}N$ is grown to 0.15 µm thickness at 800° C. using TMG, TMI (trimethylindium) and ammonia. This crack inhibiting layer may be omitted.

(n-Type Cladding layer)

Then, at 1050° C. an A layer of undoped AlGaN is grown to 25 Å thickness using TMA (trimethylaluminum), TMG and ammonia as source gases thickness. Subsequently, the TMA gas is stopped. A B layer of GaN doped with Si at $5\times10^{18}/cm^3$ to 25 Å thickness is grown using a silane gas as an impurity gas. These operations are repeated 160 times each to laminate A layers and B layers, to form an n-type cladding layer of a multilayer film (super-lattice structure) with a total thickness of 8000 Å. If the ratio of Al in a mixed crystal of undoped AlGaN is within the range of not less than 0.05 to not more than 0.3, the cladding layer has a sufficient refraction index difference for its function.

(n-Type Light Guide Layer)

Next, at the same temperature, an n-type light guide layer of undoped GaN is grown to 0.1 µm thickness using TMG and ammonia as source gases. An n-type impurity may be doped.

(Active Layer)

Next, at 800° C., a barrier layer of $In_{0.05}Ga_{0.95}N$ doped with Si at $5\times10^{18}/cm^3$ is grown to 100 Å thickness using TMI (trimethylindium), TMG and ammonia as source gases and silane gas as an impurity gas. Subsequently, the silane gas is stopped, and a well layer of undoped $In_{0.1}Ga_{0.9}N$ is grown to 50 Å thickness. These operations are repeated three times to form an active layer of multiple quantum well structure (MQW) having a total thickness of 550 Å with the barrier layer on the top.

(P-type Electron Trap Layer)

Next, at the same temperature, a p-type electron trap layer of AlGaN doped with Mg at $1\times10^{19}/cm^3$ is grown to 100 Å thickness using TMA, TMG and ammonia as source gases and $Cp_2Mg$ (cyclopentadienylmagnesium) as an impurity gas. This layer may not be provided particularly, but the layer acts to trap electrons and contributes to a reduced threshold current density.

(P-type Light Guide Layer)

Next, at 1050° C., a p-type light guide layer of undoped GaN is grown to 750 Å thickness using TMG and ammonia as source gases. This p-type light guide layer is grown as an undoped layer but exhibits p-type property with a Mg concentration of $5\times10^{16}/cm^3$ by Mg diffusion from the p-type electron trap layer. Or this layer may be doped with Mg at growing intentionally.

(P-type Cladding Layer)

Subsequently, at 1050° C., a layer of undoped $Al_{0.16}Ga_{0.84}N$ is grown to 25 Å thickness. Then, TMA is stopped and a layer of Mg-doped GaN is grown to 25 Å thickness using $Cp_2Mg$. Thus a p-side cladding layer is formed of a super lattice layer having a total thickness of 0.6 µm. In the case where the p-side cladding layer is formed of super lattice structure including nitride semiconductor layers with different band gap energies at least one of which layers contains Al, the crystallinity tends to be good if either one of the nitride semiconductor layers is doped with more impurity, that is, if so-called modulation-doping is performed. However, both the layers may be equally doped. Preferably the cladding layer has the supper lattice structure including a nitride semiconductor layer containing Al, more preferably, including $Al_xGa_{1-x}N$ (0<X<1), still more preferably the supper lattice structure of a laminate of GaN and AlGaN. Where the p-type cladding layer is of the supper lattice structure, the ratio of Al in a mixed crystal in the whole cladding layer can be raised. Therefore, the refraction index of the cladding layer itself decreases, and furthermore, the band gap energy increases. That is very advantageous in reducing the threshold current density. Furthermore, since fewer pits occur in the cladding layer of the super lattice structure than a cladding layer not of the super lattice structure, the occurrence of short circuit reduces.

(P-type Contact Layer)

Lastly, at 1050° C., a p-type contact layer of GaN doped with Mg at $1\times10^{20}/cm^3$ is grown to 150 Å thickness on the p-type cladding layer. The p-type contact layer can be formed of p-type $In_XAl_YGa_{1-X-Y}N$ ($0\leq X$, $0<Y$, $X+Y\leq1$), preferably Mg-doped GaN, which provides the most preferable ohmic contact. Since an electrode is formed on the contact layer, the contact layer preferably has a high carrier concentration of $1\times10^{17}/cm^3$ or more. If the concentration is lower than $1\times10^{17}/cm^3$, it tends to be difficult to obtain a good ohmic with the electrode. Further, if the contact layer is composed of GaN, it is easier to obtain a good ohmic with an electrode material. After reaction is completed, the wafer is annealed at 700° C. in a nitrogen atmosphere within the reactor to reduce the resistance of the p-type layer further.

The thus grown nitride semiconductor is patterned in a desired configuration to form electrodes and protective films. The patterning process on the nitride semiconductor layer is described with reference to FIG. 4A to 4K.

(First End-Face Etch Step: formation of resonator face and exposed face of n-type layer)

Figure 4A:
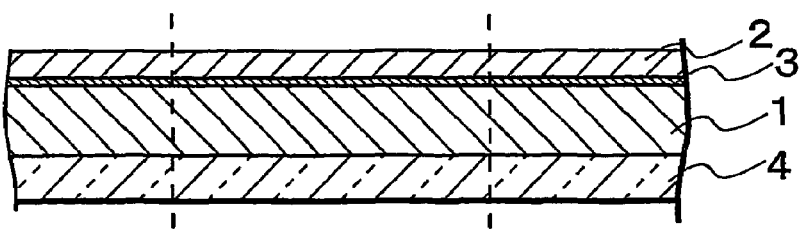
FIGS. 4A to 4K are sectional views for schematically illustrating a process of manufacturing a semiconductor laser device in accordance with an exemplary embodiment of the present invention.
Figure 4B:
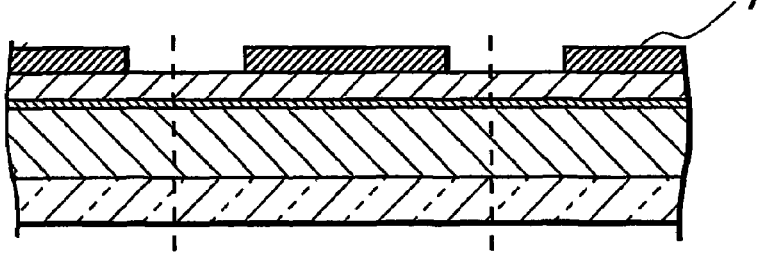
Figure 4C:
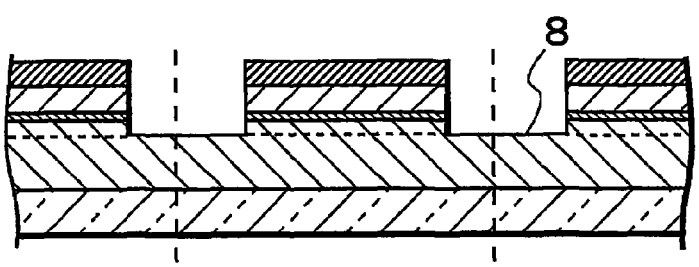

After an n-type layer 1, an active layer 3 and p-type layer 2 are laminated on a substrate 4 as shown in FIG. 4, the wafer is taken out of the reactor and a mask 7 of $SiO_2$ is formed on a surface of the topmost p-type contact layer as shown in FIG. 4B. The wafer is etched using a RIE (reactive ion etching) apparatus with a $SiCl_4$ gas to form resonator faces as shown in FIG. 4C. At the same time, a surface 8 of the n-type contact layer on which an n-electrode is to be formed is exposed. The etch distance (depth) is about 2.5 µm below the bottom of the active layer, and the bottom of etching is the upper face of the projection.

(Ridge Formation)

Next, ridges are formed in strips. A mask is formed of Si oxides (mainly $SiO_2$) to 0.5 µm thickness on almost the entire surface of the topmost p-type contact layer using a CVD apparatus, and then the mask is patterned in a desired configuration by photolithography. Striped protrusions are formed above the active layer using a RIE (reactive ion etching) apparatus with a $CF_4$ gas. The protrusions are formed by etching the p-side contact layer and part of the p-type cladding layer with the remaining p-type cladding layer having a thickness of 0.01 µm.

(Formation of Embedded Layer)

Further, the wafer with a formed waveguide region formed therein is transferred to a PVD apparatus, where an insulating film of Zr oxides (mainly $ZrO_2$) is formed to 0.5 µm thickness on the top surface of the p-type cladding layer and the section surface (side face) of the n-type cladding layer which are exposed by etching (Annealing)

After the insulating film is formed, the wafer is thermally treated at 600° C. In the case where a material other than $SiO_2$ is formed into an embedded layer, the embedded layer is rendered hardly soluble to a material for dissolving the mask by thermal treatment at 300° C. or higher, preferably 400° C. or higher, but not higher than the decomposition temperature of the nitride semiconductor (120° C.). Therefore, preferably this step is added.

(Formation of P-electrode and N-electrode)

Subsequently, the wafer is immersed in hydrofluoric acid to remove the mask on the ridges and expose the p-type contact layer. A p-electrode of Ni/Au is formed on the exposed surface of the p-type contact layer. The p-electrode 120 is formed to have a stripe width of 100 µm. Subsequently, an n-electrode of Ti/Al is formed on the already exposed surface of the n-side contact layer in parallel to the stripe. After their formation, the p-electrode and the n-electrode are each alloyed by annealing at 600° C. at an oxygen:nitrogen=80:20, and thereby, the electrode have a good ohmic contact.

(Formation of Protective Film: on Reflection Side)

Figure 4D:
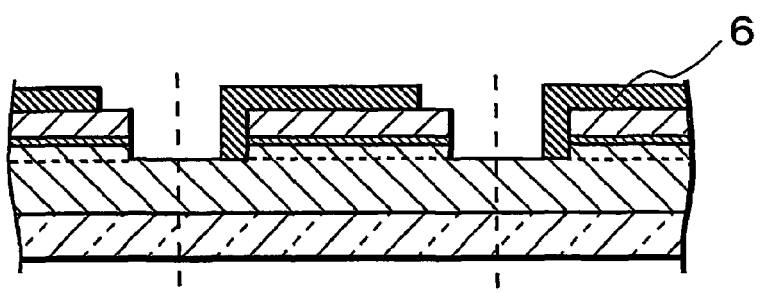

Next, a resist pattern is formed on part of the p-electrode and the n-electrode. An insulating film of two pairs of $SiO_2$ and $TiO_2$ is formed on the entire surface and lifted off to expose part of the p-electrode and the n-electrode. $SiO_2$ and $TiO_2$ function as part of the reflective film 6 of the mirror face on the emission side as shown in FIG. 4D. Thus, in Example 1, the protective film on the reflection side and that on the emission side are formed by separated steps. In Example 1, the resonator faces on the emission side and on the reflection side are formed on the right and on the left, respectively.

(Pad Electrode)

Next, pad electrodes (drawing-out electrodes) of Ni—Ti—Au (1000 Å–1000 Å–8000 Å) are formed on the p-electrode and on the n-electrode.

(Second End-Face Etch Step: Formation of End Face of Projection)

Figure 4E:
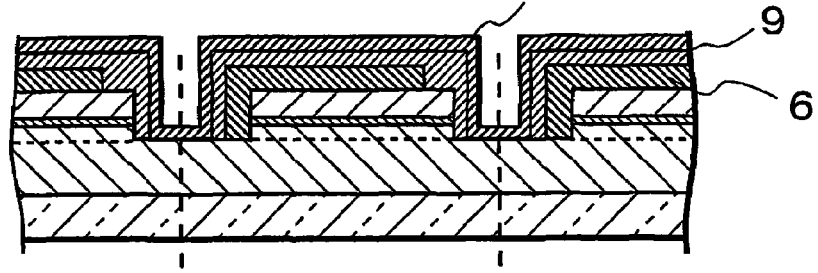

After the pad electrodes are formed as described above, a resist film 6 is formed over the resulting surface except for the exposed surface of the n-type contact layer as shown in FIG. 4E. Subsequently, a $SiO_2$ mask 10 is formed over the entire surface of the wafer as shown in FIG. 4.

Figure 4F:
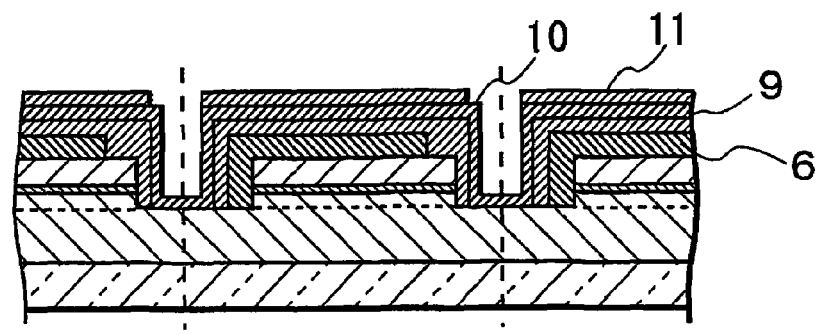

Further, a resist film 11 is formed on the $SiO_2$ mask 10 as shown in FIG. 4F. At this time, the resist film 11 is so formed that etching will reach a vicinity of the resonator face on the emission side. On the reflection side, the resist film 11 may reach an end face.

Figure 4G:
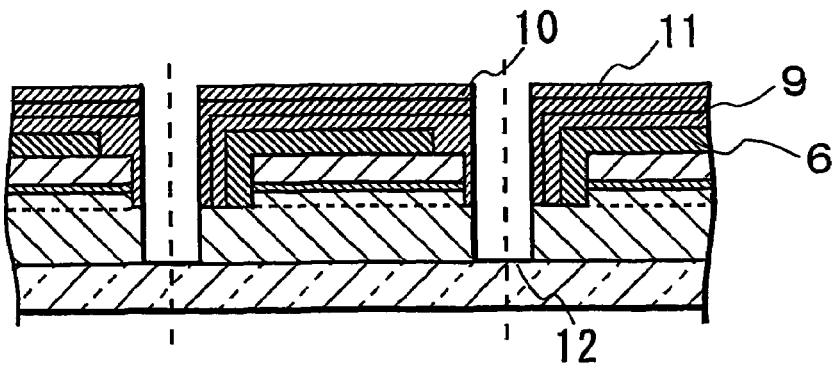

After the films are thus formed in the order of resist—$SiO_2$— resist, etching is conducted until the substrate is exposed as shown in FIG. 4G. Here, the exposed part of the $SiO_2$ film is etched. As shown in FIG. 4G, the $SiO_2$ film in front of the resonator face on the emission side which is not covered with the resist film 10 is removed, so that the resist film 9 is exposed, while on the resonator face on the reflection side, the $SiO_2$ film remains because the resist film 11 is formed to the end face. By this process, the projections have different distances on the emission side and on the reflection side as shown in FIG. 4G. On the emission side, the distance from the resonator face to the end face of the projection is about 2 to 3 µm. This distance is preferably about 1 to 3 µm. On the monitor side, the distance from the resonator face to the end face of the projection is about 5 to 8 µm.

Figure 4H:
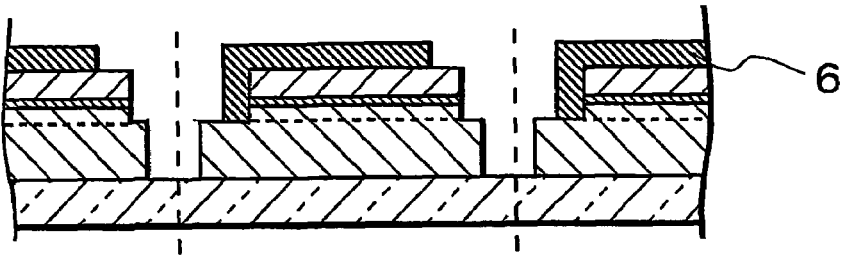

Subsequently, the resist film 9, the $SiO_2$ film 10 and the resist film 11 as mask films are removed, and thereby, a protective film is formed on the resonator face on the reflection side as shown in FIG. 4H.

(Formation of Protective Film: on Emission Side)

Figure 4I:
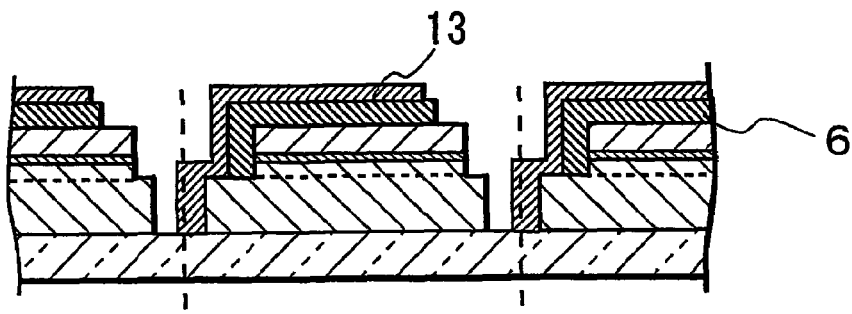
Figure 4J:
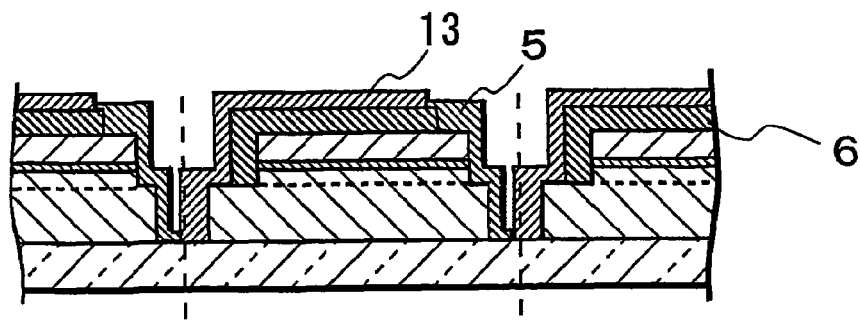

After the resonator face on the emission side is exposed by removing the mask films as shown in FIG. 4H, a resist mask 13 is formed to cover all the surface except for end faces on the emission side as shown in FIG. 4I. A protective film 5 is formed on the resonator face on the emission side. The protective film 5 is a dielectric multilayer film made of one pair of $SiO_2$ and $TiO_2$ whose thickness is 400 Å and 630 Å in an end-face direction and, in a laminating direction, about double the thickness in the end-face direction. Since the protective film 6 has already been formed on the reflection side, the protective film may be formed only on the emission side by this step. If the protective film 6 has not been formed on the reflection side yet, the protective film on the emission side may be formed of one pair of $SiO_2$ and $TiO_2$ and the protective film on the reflection side may be formed of two pairs by this step so that a difference in reflectivity is produced.

Figure 4K:
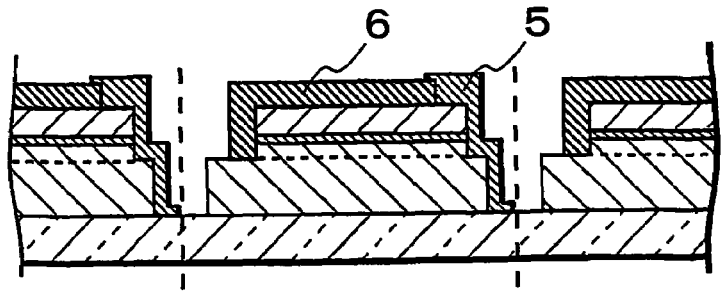

Subsequently, by removing the mask 13, the wafer with the exposed substrate can be obtained as shown in FIG. 4K.

(Chip Formation)

The sapphire substrate of the wafer as shown in FIG. 4K is polished to 170 µm thickness. The wafer is divided into bars from a substrate side in a direction (a dotted lined in figures) perpendicular to the striped electrodes. The resulting wafers in a bar shape are further divided into laser devices. At this time, the resonator face may be formed by dividing the wafer in bars on (11–00) M plane which is a cleavage plane of GaN after the substrate is exposed by etching.

It is confirmed that the thus obtained semiconductor laser device continuously oscillates at an oscillation wavelength of 405 nm at a threshold current density of 2.0 kA/cm$^2$ with a power of 30 mW at room temperature. A good beam is obtained in the FFP, especially in the emission full angle (19 to 34 degrees) of FFP-Y. The beam has an aspect ratio of 1.5. The beam exhibits satisfactory characteristics as light sources for optical disk systems. The laser device is free of shift of lateral transverse mode at an optical power range of 5 to 30 mW and can serve sufficiently as a light source for writing and reading in an optical disk system.

Example 2

In Example 2, on the emission side, the protective film on the resonator face and the protective film on the end face of the projection are formed by separate steps. By thus forming through separate steps the protective films to be formed on end faces facing in the same direction, the protective film on the end face of the projection can be formed to have a different function from that of the protective film on the resonator face.

For forming such protective films, in Example 2, the protective film is formed on the resonator face on the emission side before the second end-face etch step in which etching is performed until the exposure of the substrate, while in Example 1 the protective film is formed continuously from the resonator face to the end face of the projection on the emission side after the second etch step.

The same process as in Example 1 is carried out before the protective film on the reflection side is formed of a dielectric multilayer film composed of two pairs of $SiO_2$ and $TiO_2$. Thereafter, a resist pattern is formed over the resulting surface except for the resonator face on the emission side and a region within a distance of about 2 µm from the resonator face. Next, a protective film is formed of a pair of $SiO_2$ (400 Å) and $TiO_2$ (630 Å) on the resonator face on the emission side. Thus the protective films with different reflectivities are formed on the resonators faces on the emission side and on the monitor side. Thereafter, the second end-face etch is carried out in the same manner as in Example 1, and then the protective film is formed on the end face of the projection on the emission side. The protective film on the end face of the projection on the emission side is formed of $SiO_2$ and $TiO_2$ in a total thickness of 4120 Åµm. The same material as that for the protective films on the resonator faces may be used or a different material may be used.

The later steps are performed in the same manner as in Example 1 to obtain the semiconductor laser device of the invention. It is confirmed that the obtained semiconductor laser device continuously oscillates at an oscillating wavelength of 405 nm at a threshold current density of 22 kA/cm$^2$ with a power of 30 mW at room temperature. A good beam is obtained in the FFP, especially in the emission full angle (19 to 34 degrees) of FFP-Y. The beam has an aspect ratio of 15. The beam exhibits satisfactory characteristics as light sources for optical disk systems. The laser device is free of shift of lateral transverse mode at an optical power range of 5 to 30 mW and can serve sufficiently as a light source for writing and reading in an optical disk system. Particularly, compared with Example 1, the reflectivity of the projection is larger and the leakage light from the emission side is less.

Example 3

In Example 3, the protective film on the emission side is not formed to reach the substrate. In the second etch step in Example 1, etching is stopped to such an extent that the base layer formed on the sapphire substrate is exposed. The later steps are performed in the same manner as in Example 1. Thereby, in the last chip formation step, the semiconductor laser device of the invention is completed by dividing the sapphire substrate and the semiconductor layer. It is confirmed that the obtained semiconductor laser device continuously oscillates at an oscillation wavelength of 405 nm at a threshold current density of 20 kA/cm$^2$ with a power of 30 mW at room temperature. A good beam is obtained in the FFP, especially in the emission full angle (19 to 34 degrees) of FFP-Y. The beam has an aspect ratio of 1.5. The beam exhibits satisfactory characteristics as light sources for optical disk systems. The laser device is free of shift of lateral transverse mode at an optical power range of 5 to 30 mW and can serve sufficiently as a light source for writing and reading in an optical disk system. Particularly, since the substrate warps more by stopping etching in the semiconductor layer above the substrate, the yield in the chip formation step tends to decrease in some cases.

INDUSTRIAL APPLICABILITY

In the semiconductor laser device of the present invention having the resonator face formed by etching, the protective film formed on the semiconductor laser device covers not only the resonator face but also other end faces. Furthermore the protective film is formed so as not to block the laser beam emitted from the resonator face. Thereby the semiconductor laser device has an excellent FFP and is not liable to deteriorate. Further, because the semiconductor layer is suitable for forming the protective film in an intended thickness, the target semiconductor layer device can be obtained efficiently.

We claim:

1. A semiconductor laser device having, on a substrate, a semiconductor layer including an active layer sandwiched between an n-type layer and a p-type layer, the semiconductor layer having a resonator face formed by etching and a projection projecting out in an emission direction relatively to the resonator face, wherein a protective film is formed to extend continuously from the resonator face to an end face of the projection, and, an emission critical angle, which is the largest angle at which light emitted from the resonator face can be radiated without being blocked by the projection and the protective film formed on the projection, is larger than an emission half-angle of an emission distribution in a vertical direction of a laser beam emitted from the resonator face.

2. A semiconductor laser device having, on a substrate, a semiconductor layer including an active layer sandwiched between an n-type layer and a p-type layer, the semiconductor layer having a resonator face formed by etching and a projection projecting out in an emission direction relatively to the resonator face, wherein a protective film is formed to extend continuously from the resonator face to an end face of the projection, and, an angle β, which satisfies the relational expression:

tan β=Y/X in which X is the distance from a surface of the protective film on the end face of the projection to the resonator face and Y is the distance from a topmost face of the protective film on an upper face of the projection to an emission portion of the resonator face, is larger than an emission half-angle of an emission distribution in a vertical direction of laser beam emitted from the resonator face.

3. A semiconductor laser device according to claim 1, wherein the projection is such that the distance from a lower end of the active layer to an upper face of the projection is larger than the distance from the resonator face to the end face of the projection.

4. A semiconductor laser device according to claim 1, wherein the projection is such that the distance from a lower end of the active layer to an upper face of the projection is smaller than the distance from the resonator face to the end face of the projection.

5. A semiconductor laser device according to claim 1, wherein the emission half-angle 0 is a half angle at half maximum of the emission distribution.

6. A semiconductor laser device according to claim 1, wherein the protective film is formed to extend continuously from the resonator face to the end face of the projection.

7. A semiconductor laser device according to claim 1, wherein the protective film is formed to reach a surface of the substrate.

8. A semiconductor laser device according to claim 1, wherein the protective film is formed at least on a laser beam emission side.

9. A semiconductor laser device according to claim 1, wherein the protective film has a curved surface at an edge defined between the upper face and the end face of the projection.

10. A semiconductor laser device according to claim 1, wherein an end face of a projection on a monitor side has a lower reflectivity than the projection on the emission side.

11. A semiconductor laser device according to claim 1, wherein, on a monitor side opposite to the resonator face on the emission side, a protective film is formed on a resonator face and the semiconductor layer is exposed at an end face of a projection.

12. A semiconductor laser device according to claim 1, wherein the protective film is a multilayer film.

13. A process of producing a semiconductor device, said process-comprising:

(a) after forming an n-type layer, an active layer and an p-type layer sequentially on a substrate to form a semiconductor layer, etching the semiconductor layer until the n-type layer is exposed, thereby forming a resonator face;

(b) after forming a mask on the resonator face, further etching the n-type layer exposed by the first end-face etch step until at least a portion of the substrate is exposed, thereby forming a projection;

(c) removing the mask to expose the resonator face; and (d) forming a protective film continuously from the exposed resonator face to an end face of the projection.

14. A process of producing a semiconductor device according to claim 13, wherein the substrate is exposed by step (b).

15. A process as in claim 13, wherein the semiconductor device produced comprises an emission critical angle, which is the largest angle at which light emitted from the resonator face can be radiated without being blocked by the projection and the protective film formed on the projection, is larger than an emission half-angle of an emission distribution in a vertical direction of a laser beam emitted from the resonator face.

16. A process for making a semiconductor laser device having, on a substrate, a semiconductor layer including an active layer sandwiched between an n-type layer and a p-type layer, the semiconductor layer having a resonator face formed by etching and a projection projecting out in an emission direction relatively to the resonator face, said process comprising:

forming a protective film to extend continuously from the resonator face to an end face of the projection, and, forming an emission critical angle, which is the largest angle at which light emitted from the resonator face can be radiated without being blocked by the projection and the protective film formed on the projection, to be larger than an emission half-angle of an emission distribution in a vertical direction of a laser beam emitted from the resonator face.

17. A process for making a semiconductor laser device having, on a substrate, a semiconductor layer including an active layer sandwiched between an n-type layer and a p-type layer, the semiconductor layer having a resonator face formed by etching and a projection projecting out in an emission direction relatively to the resonator face, said process comprising:

forming a protective film to extend continuously from the resonator face to an end face of the projection, and forming an angle $\beta$, which satisfies the relational expression:

$\tan \beta = Y/X$ in which X is the distance from a surface of the protective film on the end face of the projection to the resonator face and Y is the distance from a topmost face of the protective film on an upper face of the projection to an emission portion of the resonator face, to be larger than an emission half-angle of an emission distribution in a vertical direction of laser beam emitted from the resonator face.

* * * * *